United States Patent
Ohmi et al.

(10) Patent No.: US 7,173,553 B2
(45) Date of Patent: Feb. 6, 2007

(54) CURRENT SUMMING DIGITAL-TO-ANALOG CONVERTER

(75) Inventors: Kazuyuki Ohmi, Kyoto (JP); Kenichi Tatehara, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/235,334

(22) Filed: Sep. 27, 2005

(65) Prior Publication Data
US 2006/0114142 A1    Jun. 1, 2006

(30) Foreign Application Priority Data
Sep. 29, 2004  (JP)  ............... 2004-284273

(51) Int. Cl.
*H03M 1/66* (2006.01)
(52) U.S. Cl. ...................... 341/145; 341/144
(58) Field of Classification Search ............... 341/144, 341/145
See application file for complete search history.

(56) References Cited

U.S. PATENT DOCUMENTS 5,748,128 A * 5/1998 Bruccoleri et al. ......... 341/144
6,469,646 B1 * 10/2002 Song ......................... 341/144
6,633,248 B2 * 10/2003 Song ......................... 341/144
6,650,265 B1 * 11/2003 Bugeja ...................... 341/144

FOREIGN PATENT DOCUMENTS

| EP | 0095674 | 12/1983 |
| JP | 55034536 | 3/1980 |
| JP | 58220523 | 12/1983 |
| JP | 59186416 | 10/1984 |
| JP | 62214728 | 9/1987 |

* cited by examiner

*Primary Examiner*—Peguy JeanPierre
(74) *Attorney, Agent, or Firm*—Stevens, Davis, Miller & Mosher, LLP

(57) ABSTRACT

A current summing type D/A converter having a configuration of two or more steps is provided. In a D/A converter block of the first step, by adding current segments, upper bits are D/A converted, and one of the current segments in the first step is further supplied to a D/A converter block in a second step to be shunt by the D/A converter block in the second step, so that lower bits are D/A converted. The output current in the first step and the output current in the second step are then added each other. According to the foregoing method, the D/A conversion may be performed without causing a differential linearity error.

12 Claims, 23 Drawing Sheets

Fig. 2B

DECODER 230A

| B9 B8 | C1 C2 C3 C4 | D1 D2 D3 D4 |
|-------|-------------|-------------|
| 0  0  | 0  0  0  0  | 1  0  0  0  |
| 0  1  | 1  0  0  0  | 0  1  0  0  |
| 1  0  | 1  1  0  0  | 0  0  1  0  |
| 1  1  | 1  1  1  0  | 0  0  0  1  |

$\overline{X}$ IS AN INVERSION OF X

Fig. 5B

DECODER 330B

| B9 B8 | C1 C2 C3 C4 | D1 D2 D3 D4 | E1 E2 E3 E4 |
|---|---|---|---|
| 0 0 | 0 0 0 0 | 1 0 0 0 | 0 1 1 1 |
| 0 1 | 1 0 0 0 | 0 1 0 0 | 0 0 1 1 |
| 1 0 | 1 1 0 0 | 0 0 1 0 | 0 0 0 1 |
| 1 1 | 1 1 1 0 | 0 0 0 1 | 0 0 0 0 |

$\overline{X}$ IS AN INVERSION OF X

Fig. 7B

DECODER 430C

| B7 B6 B5 B4 B3 B2 B1 B0 | C1 | C2 | C3 | | C253 | C254 | C255 |
|---|---|---|---|---|---|---|---|
| 0  0  0  0  0  0  0  0 | 0 | 0 | 0 | | 0 | 0 | 0 |
| 0  0  0  0  0  0  0  1 | 1 | 0 | 0 | ... | 0 | 0 | 0 |
| 0  0  0  0  0  0  1  0 | 1 | 1 | 0 | | 0 | 0 | 0 |
| 0  0  0  0  0  0  1  1 | 1 | 1 | 1 | | 0 | 0 | 0 |
| ⋮ | | | | | ⋮ | | |
| 1  1  1  1  1  1  0  1 | 1 | 1 | 1 | | 1 | 0 | 0 |
| 1  1  1  1  1  1  1  0 | 1 | 1 | 1 | ... | 1 | 1 | 0 |

RELATED ART

RELATED ART

CURRENT SUMMING DIGITAL-TO-ANALOG CONVERTER

BACKGROUND OF THE INVENTION

1. Field of the Invention

The present invention relates to a current summing type D/A (digital to analog) converter, an A/D (analog to digital) converter using the D/A converter, and a signal converter including the D/A converter or the A/D converter.

2. Description of the Related Art

There exists a semiconductor integrated circuit, which incorporates a large number of D/A (digital to analog) converters to perform signal processing. To achieve high accurate performance has been strongly required particularly to the D/A converter, and the resolution of the D/A converter has been improved by increasing the number of bits in a digital signal.

FIG. 10 is an example showing a signal converter, i.e., a laser output unit. In this signal converter, a current is provided to a laser diode (LD) to be emitted, and by adjusting a current value of the LD using the D/A converter, the laser diode is controlled so as to provide an optimum laser power.

In this signal converter, a digital-to-analog conversion is performed by a D/A converter 5 based on a current $I_{REF}$ outputted from a reference current source 1. More specifically, based on the current $I_{REF}$, the D/A converter 5 outputs a current corresponding to a digital set point D9 to D0. In this signal converter, an ON/OFF control is also performed to the current outputted from the D/A converter using a current mirror CM11 provided with a switch SW101. Thus, a current provided to a laser diode (LD) 2 is ON/OFF controlled to thereby provide a laser output light to be switched. The current mirror CM11 is composed of transistors M101 and M102.

The laser light outputted from the laser diode 2 may be used as, for example, a recording signal for an optical disk such as DVD or CD. In this signal converter, the output current value is adjusted by changing the digital set point D9 to D0 of the D/A converter 5, allowing an optimum power output to be used as the recording signal for DVD and CD.

Apart of the laser light outputted therefrom is inputted to a photodiode (PD) 3. A voltage V101 is applied to the photo diode 3 shown in FIG. 10 by a DC power supply 101. A current generated by the laser light inputted to the photodiode 3 is current-voltage converted by a resistor R, and further analog-to-digital (A/D) converted by an A/D converter 6 through a DC voltage measurement circuit 4. The D/A converter 5 is controlled based on the digital data, thus making it possible to adjust the laser power.

FIGS. 11A and 11B are circuit configurations of a conventional D/A converter (10-bit configuration). FIG. 11A shows a schematic circuit diagram, while FIG. 11B shows a specific circuit diagram.

In FIGS. 11A and 11B, the reference current $I_{REF}$ inputted from a terminal $I_{IN}$ is outputted as a current from the current mirror CM12 composed of transistors Q212 and Q213. Weighted transistors Q201 through Q211 have a grounded-base configuration and are connected to a voltage source V201. The current $I_{REF}$ is shunt by the grounded-base transistors Q201 through Q211 and ladder connected resistors 102 of R-2R, and the resultant current is outputted to a terminal $I_{OUT}$ or a voltage source V202 through a set of switches 7 composed of switches SW201 through SW211. According to the aforementioned operation, the D/A converted current is outputted to the terminal $I_{OUT}$.

The conventional D/A converter, however, has had two problems to be solved. One is a layout pattern, while the other is a change in characteristics due to manufacturing variability of the resistors.

The conventional D/A converter shown in FIGS. 11A and 11B requires the weighted grounded-base transistors Q201 through Q211. The attempt to increase the manufacturing accuracy for the transistors will necessarily result in an increase in size of the transistor Q211. The weighting may increase the transistor Q201, a tenth bit of the digital code, by 512 times of the transistor Q211 in size. As a result, the pattern layout configuration has been increased, while producing an irregular shape, so that the conventional D/A converter has had a problem that the optimization has been difficult.

Japanese Unexamined Patent Publication (Kokai) No. S62-214728 (Patent Application No. S61-56850) discloses an attempt to eliminate the weight for the transistors by adding a correction current to a base current of the transistor. The current variation produced by a change in resistance value of the resistorR caused by the manufacturing variability, however, could not be prevented. The change in characteristics caused by the variation in the resistance value of the resistor R has been a significant issue in the D/A converter, especially in the high-resolution D/A converter with a large bit number.

A connection relation among the switches SW201 through SW211 shown in FIG. 11B represents a current output state when a digital code "1000000000" is inputted. This corresponds to a next code of the digital code "0111111111", so that the current value thereof must be equal to a current value of the digital code "0111111111" added to that of 1LSB. In other words, the current flowing through the transistor Q201 must be equal to the sum of the currents flowing through the transistors Q202 through Q211. In this case, even when the resistance value of the resistor R1 is deviated from a predetermined value thereof by 1/512=0.2%, that will lead the transistor Q201 corresponding to the upper bits to cause a current error by 1LSB.

Similarly, the current flowing through the transistor Q202 must be equal to the sum of the currents flowing through the transistors Q203 through Q211. When the variation by 1/256=0.4% of the resistance value of the resistor R2 is produced by the manufacturing variability, the current error will occurs in the output current by 1LSB.

An aspect of the current error affecting the characteristics in this case is shown in FIG. 12. Due to the variation in the resistance values of the resistors R1 and R2 shown in FIG. 11, the current error is produced in the upper 2 bits of the 10-bit D/A converter, and step heights (differential linearity error) are generated at three points in the output current characteristics as shown in FIG. 12.

In the signal converter for driving the laser diode shown in FIG. 10, the laser control current is feedback-controlled through a path from the D/A converter 5, the laser diode 2, the photodiode 3, the A/D converter 6, to the D/A converter 5. As a result, when the D/A converter has had the characteristics to generate the step height as shown in FIG. 12, there has been a problem that the current outputted to the laser diode 2 has been unstable due to the oscillation. The monotonically increasing characteristic as shown in FIG. 13 is therefore desired.

While Patent Application No. S61-56850 describes an example of a binary type D/A converter using the R-2R resistor, Japanese Unexamined Patent Publication (Kokai) No. S59-186416 (Patent Application No. S58-60881) describes an example of a current summing type D/A converter utilizing a combination of a segment type D/A converter and the binary type D/A converter using the R-2R resistor.

The errors produced in the current flowing through the D/A converter by the R-2R resistor and the current flowing through the segment type D/A converter will cause the differential linearity error during the D/A conversion. In Patent Application No. S58-60881, the current values flowing through the two D/A converters are corrected using a compensation circuit. The method described in Patent Application No. S58-60881, however, has not been able to prevent the differential linearity error due to the current error generated between the respective segments.

Japanese Unexamined Patent Publication (Kokai) No. S55-034536 (Patent Application No. S53-106675) describes a method in which the D/A conversion is achieved by connecting two current segment type D/A converters composed of current sources via the current mirror. Even by the method, however, the generation of the differential linearity error due to the error of the current mirror has not been able to be reduced.

While the device shown in FIG. 10 includes the D/A converter for converting the reference current, there is an apparatus that incorporates the D/A converter other than that. FIG. 14 shows a configuration of a comparison type A/D converter incorporating the D/A converter.

According to this comparison type A/D converter, a reference voltage $VA_{REF}$ supplied from a voltage source V501 is converted into a current I501 using a differential amplifier 8A and a resistor R501, and the converted current is transmitted to a D/A converter 9 via a current mirror CM13. Using the current I501 as a reference current, the D/A conversion is then performed in the D/A converter 9 to generate a current I502. The current I502 is supplied to a resistor R502 via a current mirror CM14. The comparison voltage $V_{REF}$ is thus generated. This comparison voltage $V_{REF}$ is inputted to a comparator 8B along with an analog voltage $VA_{IN}$ inputted from an external source, and those are compared in the comparator 8B to perform the A/D conversion. A control logic 10 is driven by a Clock to search a digital result using a binary search, and outputs the result to digital output terminals D9 to D0. If the D/A converter 9 being used then has a step height in input/output characteristics as shown in FIG. 12, since a plurality of digital values will correspond to a current value in the step height portions, the conversion error may occur. The D/A converter incorporated in the comparison type A/D converter will therefore be required to have the monotonically increasing characteristics as shown in FIG. 13 as its characteristic.

In a signal processing apparatus, which drives the laser diode with the current, there has been a problem that when the step height (differential linearity error) has been generated during the D/A conversion, the laser output has been unstable due to the oscillation in setting a laser intensity. In order to solve the problem, it is necessary to achieve the monotonically increasing characteristics not having the step height during the D/A conversion characteristics; namely, the differential linearity error is small.

Meanwhile, also in the comparison type A/D converter using the D/A converter, if there is the differential linearity error in the D/A conversion section, the error is generated during the digital conversion, so that a D/A converter having the small differential linearity error will be required.

SUMMARY OF THE INVENTION

It is an object of the present invention to provide a D/A converter having an excellent differential linearity, without adding a correction circuit even in a high-resolution D/A converter with an increased number of bits, and an A/D converter and a signal converter using the same.

According to the present invention, a D/A conversion is performed in two or more steps using two or more current output type D/A converters. For example, in a first step, upper bits are D/A converted using the current segment manner, while in a second step; lower bits are D/A converted by a shunt current. At the D/A conversion performed in the second step, there is employed a method in which one of the currents generated in the first step is selected, and by shunting a current using the selected current as a reference current, the D/A conversion is then performed, and the current generated in the second step and the current generated in the first step are added each other, thereby generating an output current corresponding to digital data. As a result of this, the D/A conversion having the excellent differential linearity may be performed.

More specifically, the D/A converter according to a first aspect of the present invention includes a first D/A converter block for converting the upper bits of the digital data having of a plurality of bits, and a second D/A converter block for converting the lower bits of the digital data, wherein the digital data is D/A converted in two steps using the first D/A converter block and the second D/A converter block. The first D/A converter block includes two or more constant current sources, a first switch for adding respective output currents from constant current sources each other, the number of which corresponds to a value of the upper bits of the digital data, among the two or more constant current sources to output an added current, and a second switch for supplying a current from the remaining one constant current source among the two or more constant current sources to the second D/A converter block. Moreover, the second D/A converter block includes current shunt means for shunting the current supplied from the first D/A converter block at a shunt ratio corresponding to a value of the lower bits of the digital data and outputting a shunt current. The D/A converter outputs a current corresponding to the digital data by adding the current outputted from the first switch and the current outputted from the current shunt means each other.

In addition, a D/A converter according to a second aspect of the present invention includes a first D/A converter block for converting upper bits of digital data including of a plurality of bits, and a second D/A converter block for converting lower bits of the digital data, wherein the digital data is D/A converted in two steps using the first D/A converter block and the second D/A converter block. The first D/A converter block includes the first current shunt means for shunting a constant current outputted from a reference current source at a shunt ratio corresponding to a value of the upper bits of the digital data to output a shunt current, and shunting the current outputted from the reference current source into a value corresponding to a weight of a Least Significant Bit among the upper bits of the digital data to supply a shunt current to the second D/A converter block. Moreover, the second D/A converter block includes second current shunt means for shunting the current supplied from the first D/A converter block at a shunt ratio corresponding to a value of the lower bits of the digital data to output a shunt current. The D/A converter outputs the current corresponding to the digital data by adding the current outputted from the first current shunt means and the current outputted from the second current shunt means each other.

A D/A converter according to a third aspect of the present invention, in the D/A converter of the foregoing second invention, in order to D/A convert extended digital data having an additional bit on an upper bit side of the digital data, further includes a current segment type D/A converter block which is composed of two or more current sources and outputs a current corresponding to a value of the additional bit, wherein the reference current source is any one of the two or more current sources, and wherein the output current from the current segment type D/A converter block is added to the output current from the first current shunt means and the output current from the second current shunt means, so that a current corresponding to the extended digital data is outputted.

An A/D converter according to a fourth aspect of the present invention performs the A/D conversion using the D/A converter according to any one of the foregoing first, second, and third aspects.

A signal converter according to a fifth aspect of the present invention includes at least one D/A converter according to any one of the foregoing first, second, and third aspects, wherein the output current is controlled using the D/A converter.

A signal converter according to a sixth aspect of the present invention includes at least one A/D converter according to the foregoing fourth aspect, wherein the output current is controlled using the D/A converter included in the A/D converter.

By implementing the aspects of the present invention, even when a current error occurs due to the variation in resistance caused by the manufacturing variability, occurrences of the differential linearity error can be reduced. Especially, when the high-resolution D/A conversion is performed using R-2R resistors, the current error due to the variation in resistance is significant, but the D/A conversion with the small differential linearity error can be achieved by applying the present invention.

BRIEF DESCRIPTION OF THE DRAWINGS

FIG. 2B is a view showing a truth table of the decoder being used in the first embodiment of the present invention;

FIG. 5B is a view showing a truth table of the decoder being used in the second embodiment;

FIG. 7B is a view showing a truth table of the decoder being used in the third embodiment;

DETAILED DESCRIPTION OF THE PREFERRED EMBODIMENTS

Figure 1A:
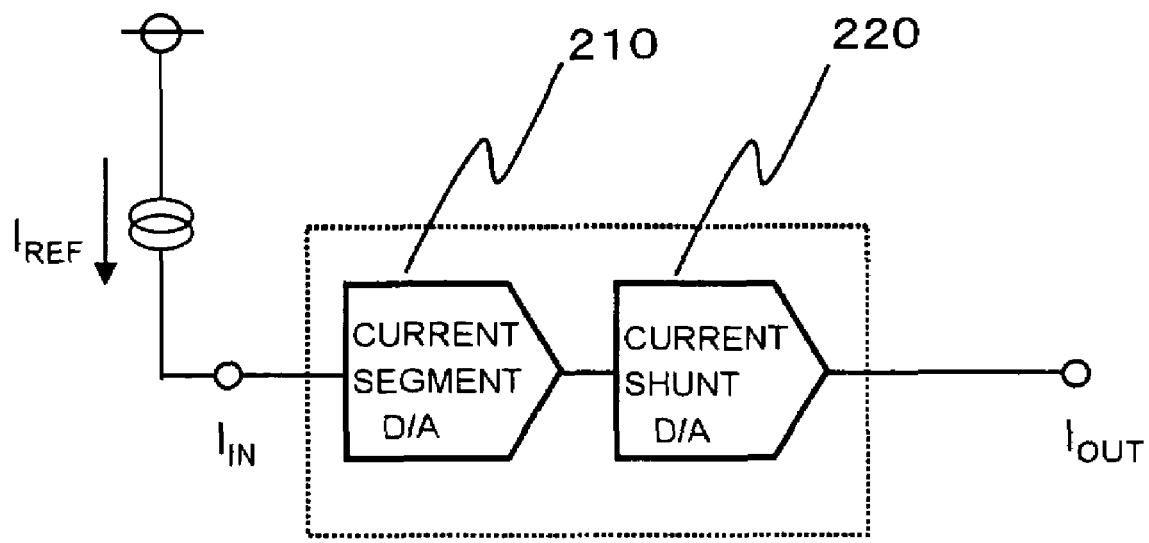
FIG. 1A is a schematic circuit diagram showing a configuration of a D/A converter according to a first embodiment of the present invention.

Hereafter, referring to the drawings, embodiments according to the present invention will be described in detail.

First Embodiment

Figure 1B:
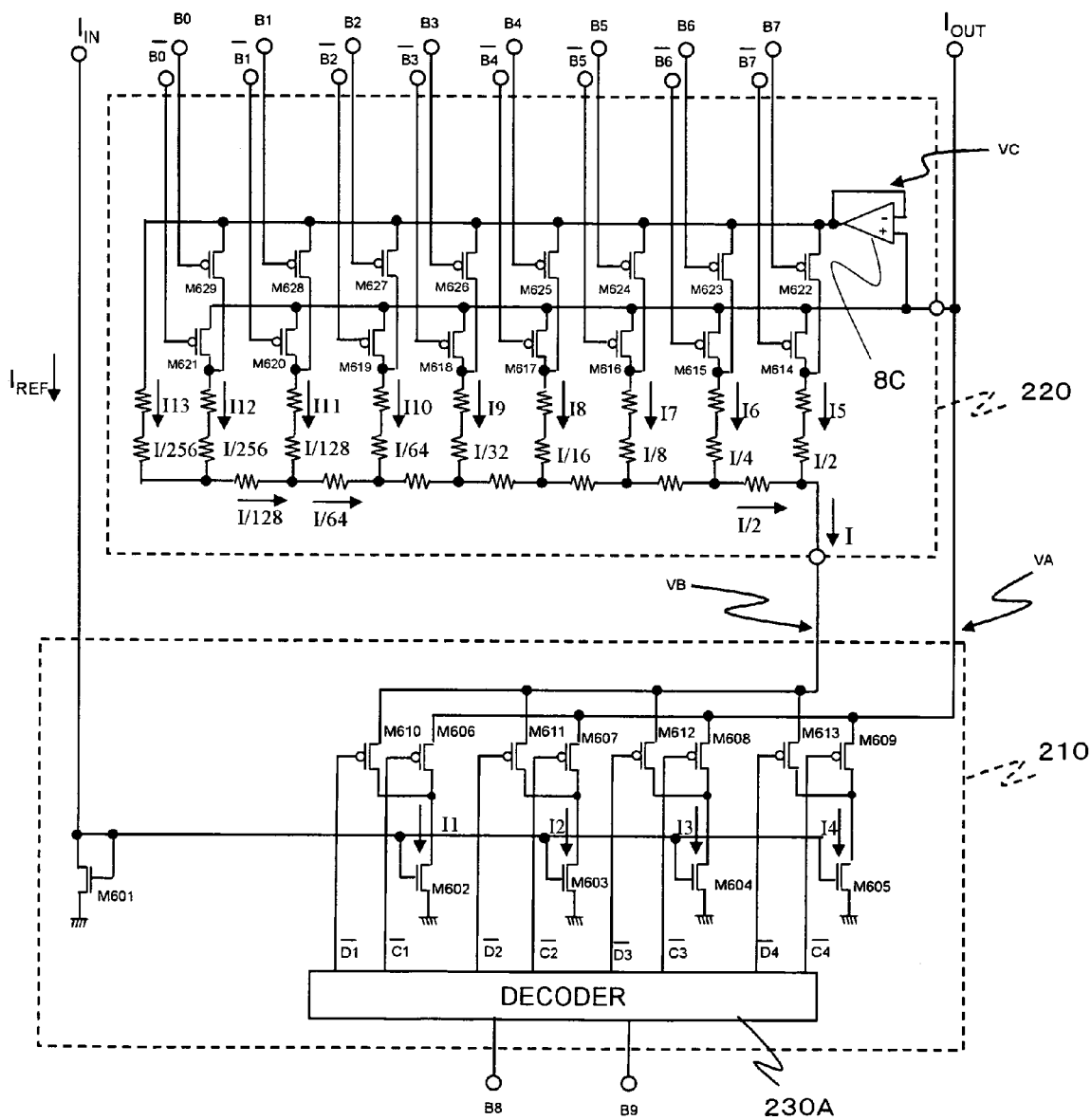
FIG. 1B is a specific circuit diagram showing the configuration of the D/A converter according to the first embodiment of the present invention.
Figure 10:
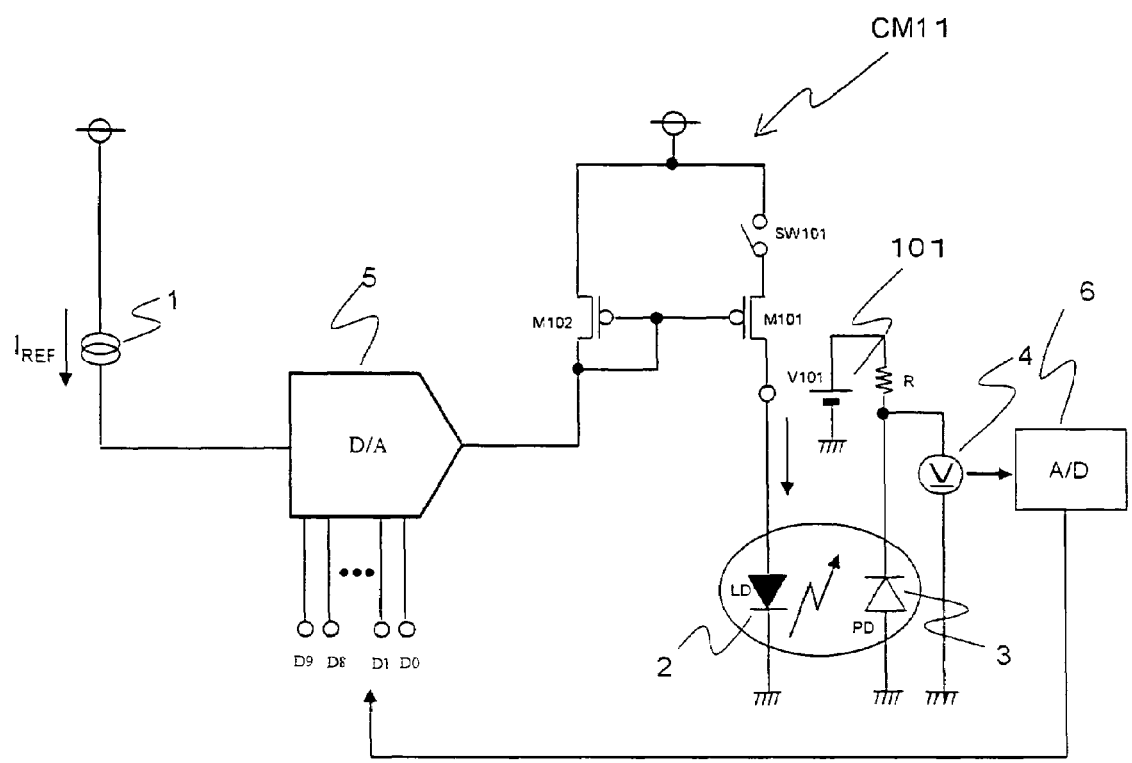
FIG. 10 is a circuit diagram showing an exemplary configuration of a conventional signal converter outputting a current for driving a laser diode.
Figure 11A:
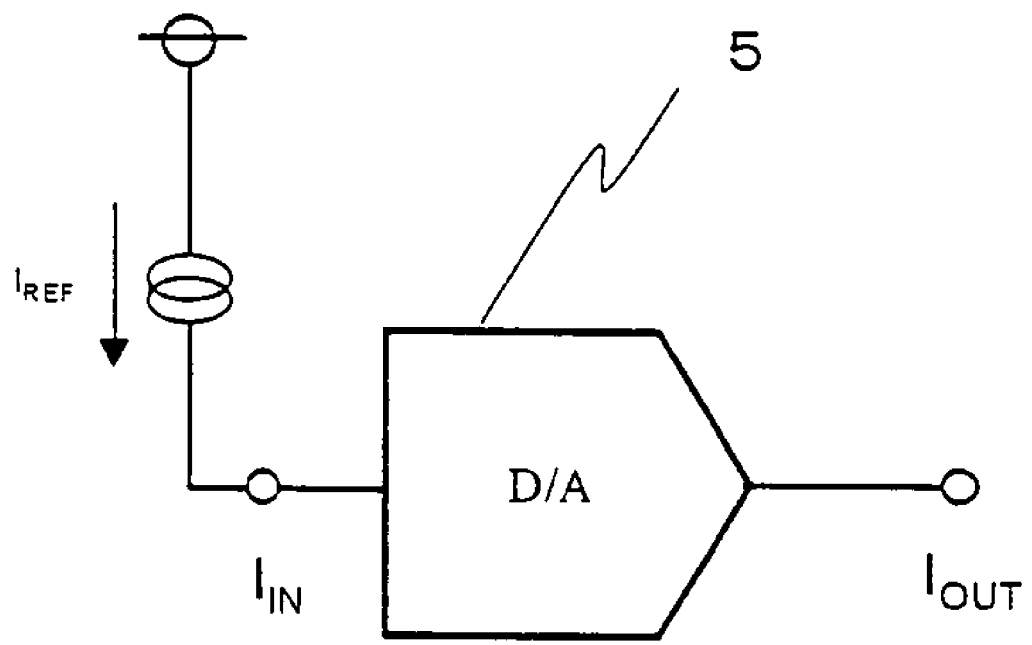
FIG. 11A is a schematic circuit diagram showing a configuration of a D/A converter being used in the conventional signal converter.
Figure 11B:
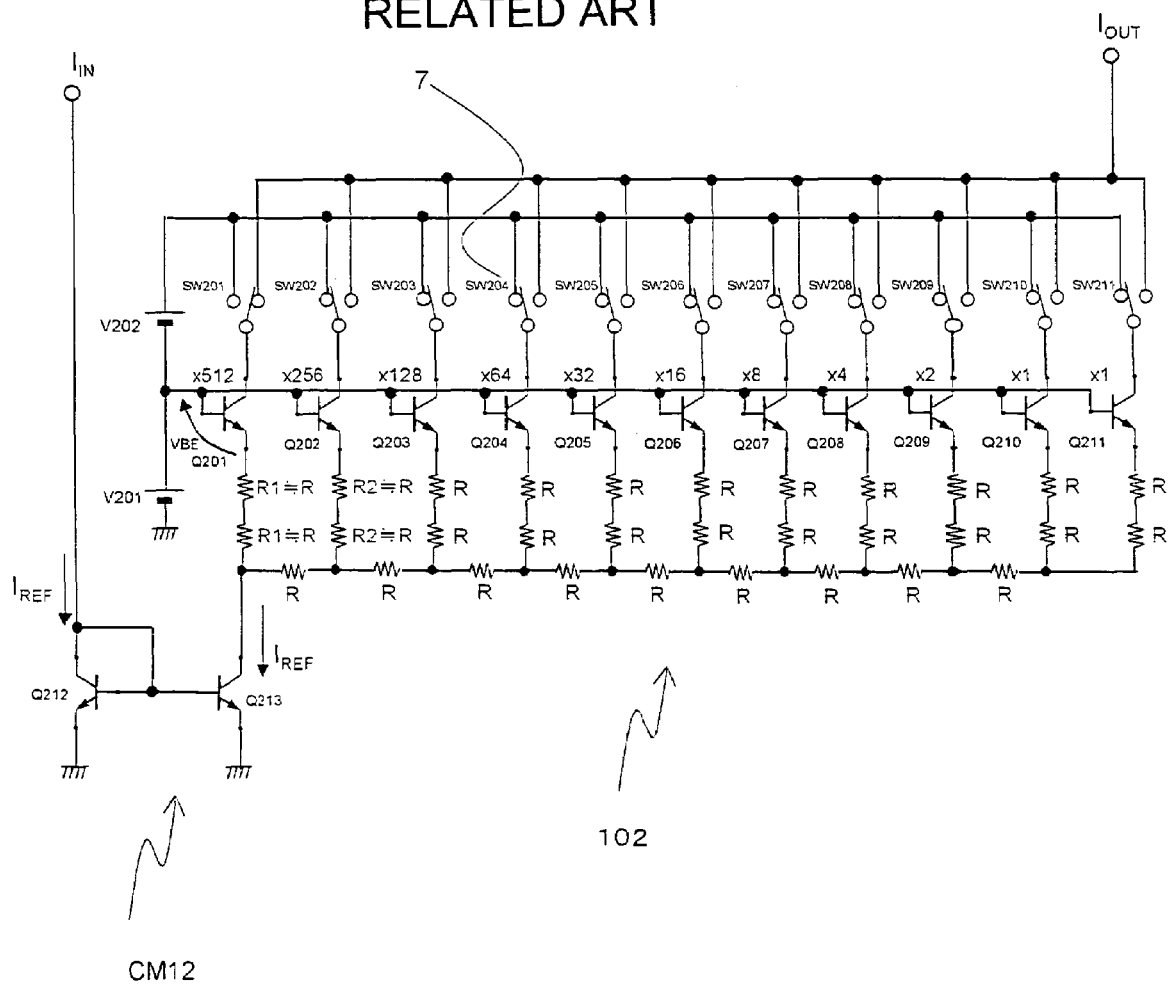
FIG. 11B is a specific circuit diagram showing the configuration of the D/A converter being used in the conventional signal converter.

FIGS. 1A and 1B show a D/A converter according to a first embodiment of the present invention. This first embodiment is obtained by applying the present invention to the D/A converter shown in FIG. 10. FIG. 1A shows a schematic circuit diagram of the D/A converter according to a first embodiment of the present invention, while FIG. 1B shows a specific circuit diagram thereof.

This D/A converter performs a 10-bit D/A conversion. In FIG. 1B, symbols B0 through B9 represent digital input codes to be converted, in which symbols B9 is an input signal corresponding to MSB (Most Significant Bit) and symbol B0 is an input signal corresponding to LSB (Least Significant Bit) Symbol "−" on the top of symbols B9 through B0 means an inversion thereof.

According to the first embodiment shown in FIGS. 1A and 1B, upper 2 bits (B9, B8) of the digital input code, namely, digital data to be converted, are D/A converted using a current segment manner, while remaining lower 8 bits (B7 through B0) are D/A converted using the currents shunt by the R-2R resistors. Symbol 210 represents a D/A converter block for D/A converting the upper 2 bits using the current segment manner. Symbol 220 represents a D/A converter block for D/A converting the lower 8 bits using the currents shunt by the R-2R resistors.

Figure 2A:
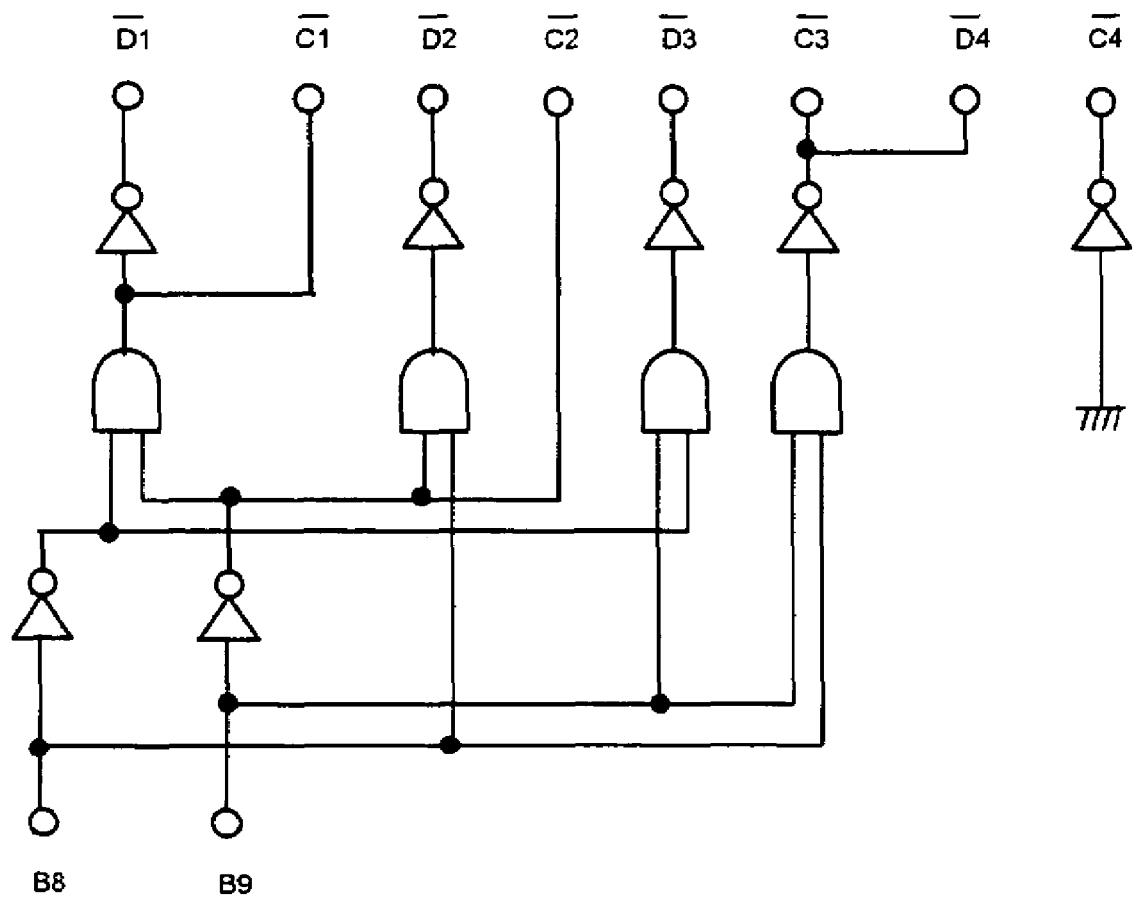
FIG. 2A is a circuit diagram showing an internal configuration of a decoder being used in the first embodiment of the present invention.

A decoder 230A shown in FIG. 1B outputs a control signal for performing ON/OFF control of selection resistors M606 through M613. An internal circuit diagram of the decoder 230A is shown in FIG. 2A, while a truth table of the decoder 230A is shown in FIG. 2B.

In the D/A converter block 210, current sources I1 through I4 are configured, each outputting the same current value based on a reference current $I_{REF}$ inputted from a terminal $I_{IN}$, by a current mirror composed of transistors M601 through M605. The current sources I1 through I4 shown here are the same as those represented by symbols I1 through I4 in FIG. 3. The current values of the current sources I1 through I4 may be different due to manufacturing variability.

Moreover, the D/A converter block 210 includes the selection transistors M606 through M613, each two being assigned to each of the current sources I1 through I4, and outputs an output current of one transistor to a node VB for D/A converting the lower bits, and an output current of the other transistor to a node VA to be an output terminal. Here, the digital codes B9=1, B8=0, B7=1, B6 through B0=0 are inputted, and the D/A conversion for outputting the output currents corresponding to the input digital codes is performed (refer to FIG. 3).

The currents I1 and I2 generated by the transistors M602 and M603 shown in FIG. 1B are outputted to the node VA of the current output terminal $I_{OUT}$ through the selection transistors M606 and M607. The current I3 generated by the transistor M603 is outputted to the node VB through the selection transistor M612. The current that is outputted to the node VB is to be D/A converted by the D/A converter block (shunt) 220 for converting the lower bits.

A section represented by symbol 220 in FIG. 1B is the D/A converter block (shunt) for D/A converting the lower bits. In the D/A converter block 220, a voltage of a section represented by a node VC is adjusted to be equal to that of the node VA using a voltage follower composed of a differential amplifier 8C. Selection transistors M614 through M629 have sufficiently smaller on-resistance compared to the resistor R.

The selection transistors M614 through M621 and selection transistors M622 through M629 are exclusively electrically conducted, respectively.

Here, it is assumed that a current value I/256 is generated on the current I13 shown in FIG. 1B. Since the nodes VA and VC are at the same potential, the same current value I/256 is also generated on the current I12. In a manner similar to that, a current corresponding to (I/256+I/256=I/128) is also generated on the current I11. Current are also generated on up to the current I5 in a manner similar to that, causing a current I for the node VB.

When the current I3 is supplied to the node VB, the current I3 is shunt by the resistors R, and the current corresponding to (I3)/2 is outputted to the node VA in the case of B7=1 and B6 through B0=0.

Accordingly, the current I1+I2+(I3/2) is outputted at the node VA, allowing a D/A converted current to be outputted. Even when the lower bits B6 through B0 are changed, the current source I3 remains unchanged, but the current is continuously changed, and when B9=1 and B8=1 are achieved, the current I1+I2+I3 is outputted to the output terminal. When the digital codes are further increased and become from a range of B9=1, B8=1, B7 through B0=0 to a range of B9=1, B8=1, B7 through B0=1, a current obtained by adding a shunt current of 14 to the current (I1+I2+I3) will be outputted.

Figure 12:
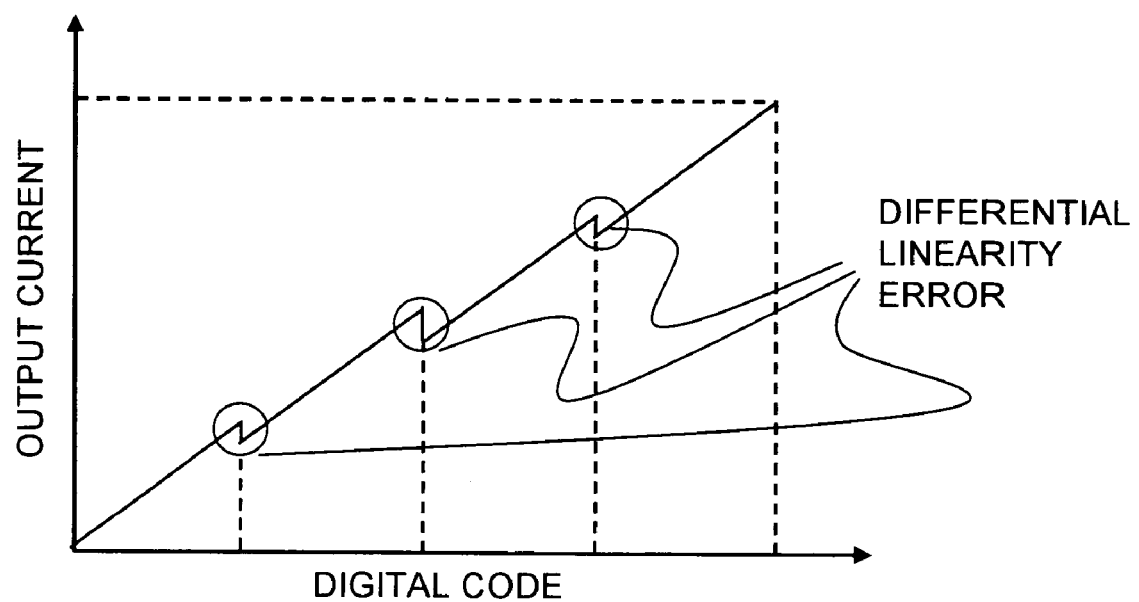
FIG. 12 is a characteristic graph showing a step height of an output current of the conventional D/A converter.
Figure 13:
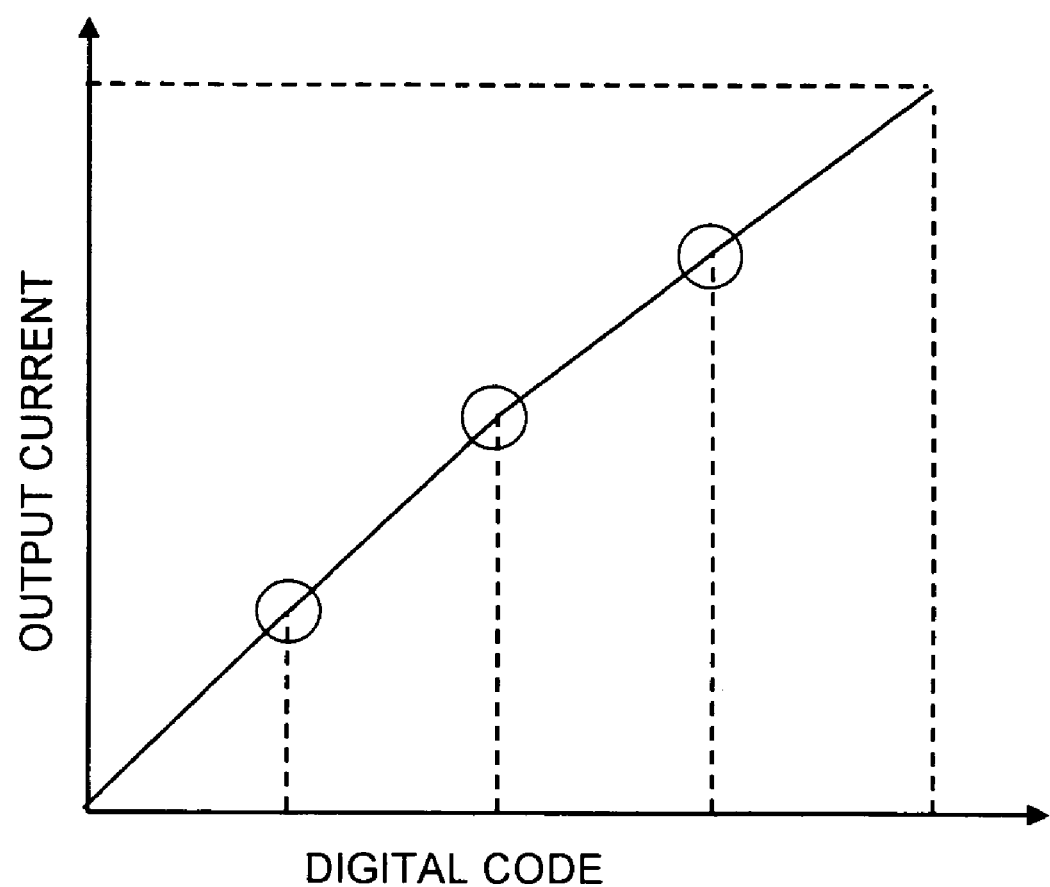
FIG. 13 is a characteristic graph of an output current with fewer step heights, which the present invention aims to achieve.
Figure 14:
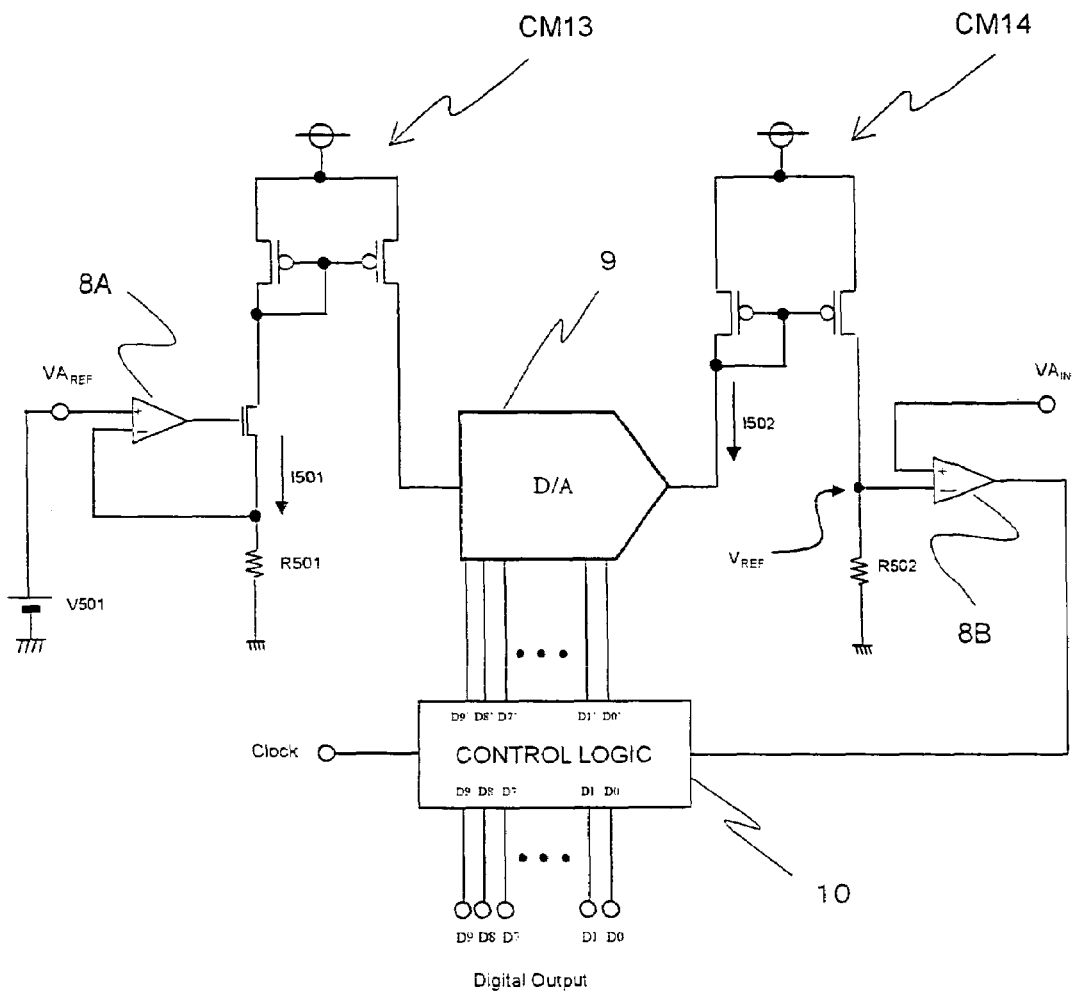
FIG. 14 is a circuit diagram showing an internal configuration of a comparison type A/D converter using the conventional D/A converter.

A differential linearity error shown in FIG. 12 occurs due to a variation in the resistance generated when the ninth and tenth bits of the digital code are D/A converted. According to the first embodiment of the present invention, however, since the D/A converter block 220, namely the shunt for D/A converting the lower bits, has an 8-bit configuration, the differential linearity error may not occur.

Figure 3:
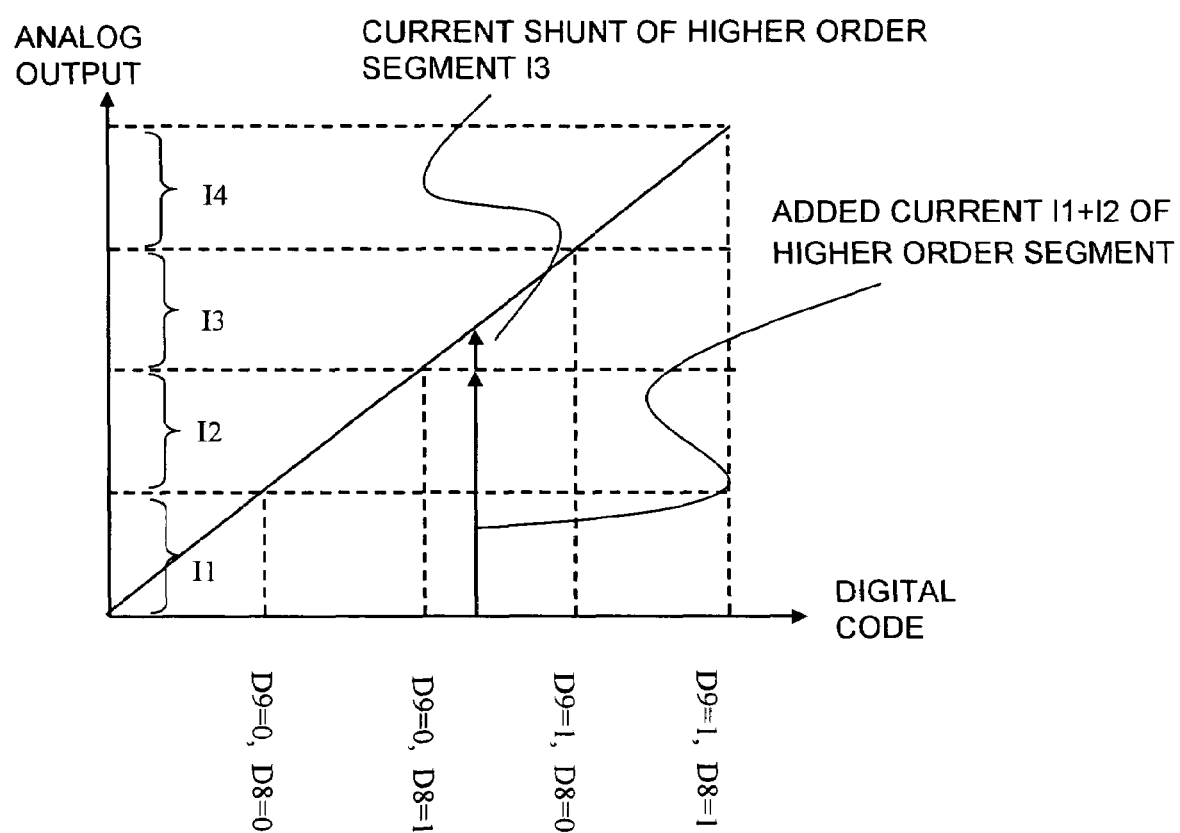
FIG. 3 is a characteristic graph of a current output showing an operation of the D/A converter according to the first embodiment of the present invention.

Moreover, even when either of the currents I1, I2, I3, or I4 may cause an error due to a variation in characteristics of the transistors, the output current is obtained by adding the currents I1 through I4 to a shunt current of either of them as shown in FIG. 3, thus making it possible to obtain monotonically increasing characteristics. By applying the present invention, continuity of the output current can therefore be maintained regardless of the manufacturing variability and the resulting variation in characteristics of the resistor R and the transistors, thus making it possible to perform the D/A conversion with an excellent differential linearity.

Second Embodiment

Figure 4A:
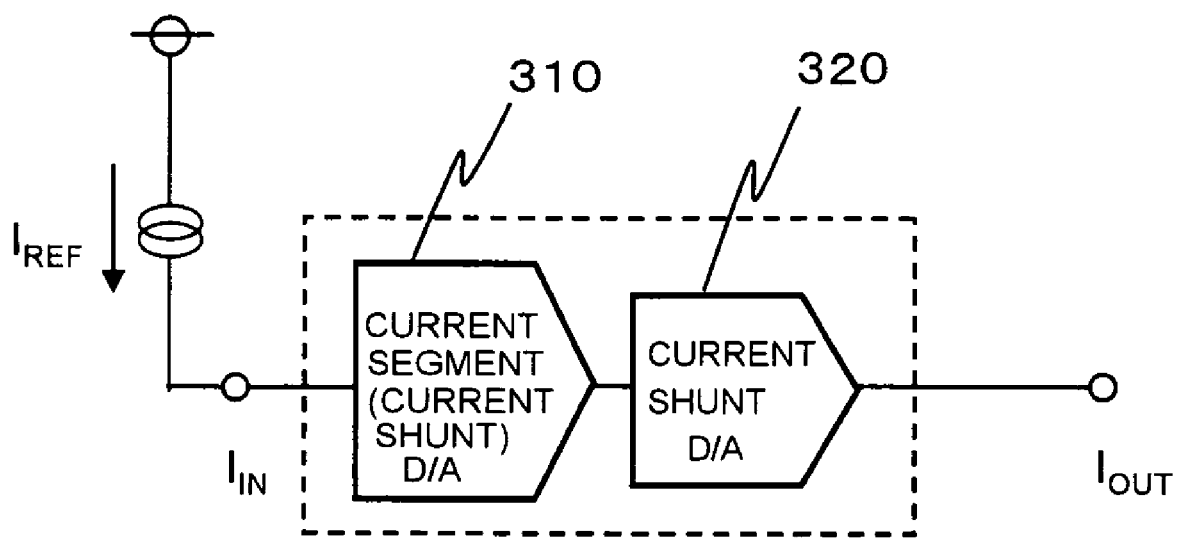
FIG. 4A is a schematic circuit diagram showing a configuration of a D/A converter according to a second embodiment of the present invention.
Figure 4B:
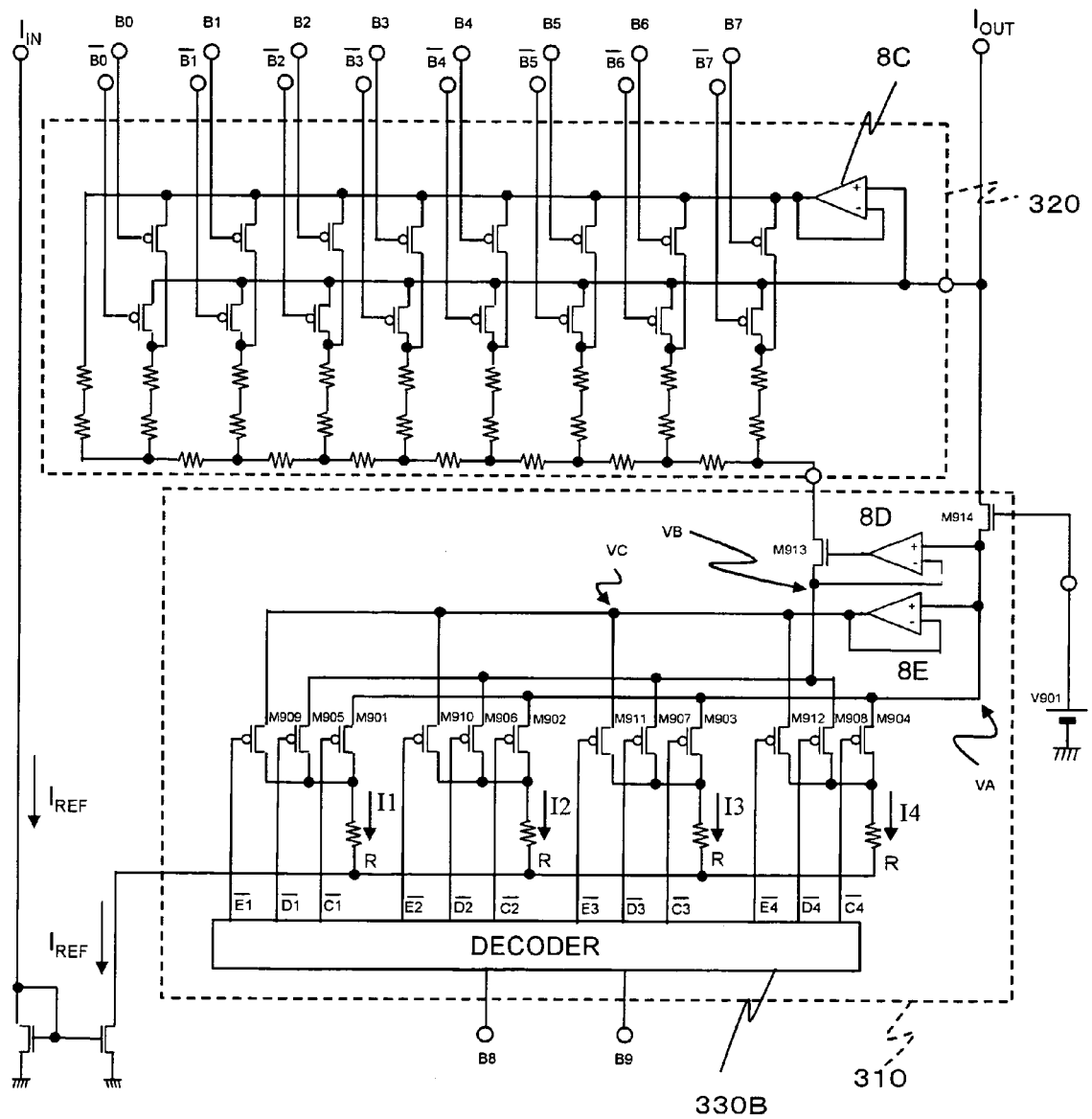
FIG. 4B is a specific circuit diagram showing the configuration of the D/A converter according to the second embodiment of the present invention.

FIGS. 4A and 4B show a D/A converter according to a second embodiment of the present invention. FIG. 4A shows a schematic circuit diagram of the D/A converter according to the second embodiment of the present invention, while FIG. 4B shows a specific circuit diagram thereof.

According to the embodiment shown in FIGS. 4A and 4B, the upper 2 bits (B9, B8) are D/A converted using the current segment manner utilizing the shunt currents, while the remaining lower 8 bits (B7 through B0) are D/A converted using the currents shunt by the R-2R resistors.

Symbol 310 represents a D/A converter block for performing the D/A conversion using the current segment manner to the upper 2 bits. Symbol 320 represents a D/A converter block for D/A converting the lower 8 bits using the currents shunt by the R-2R resistors.

Figure 5A:
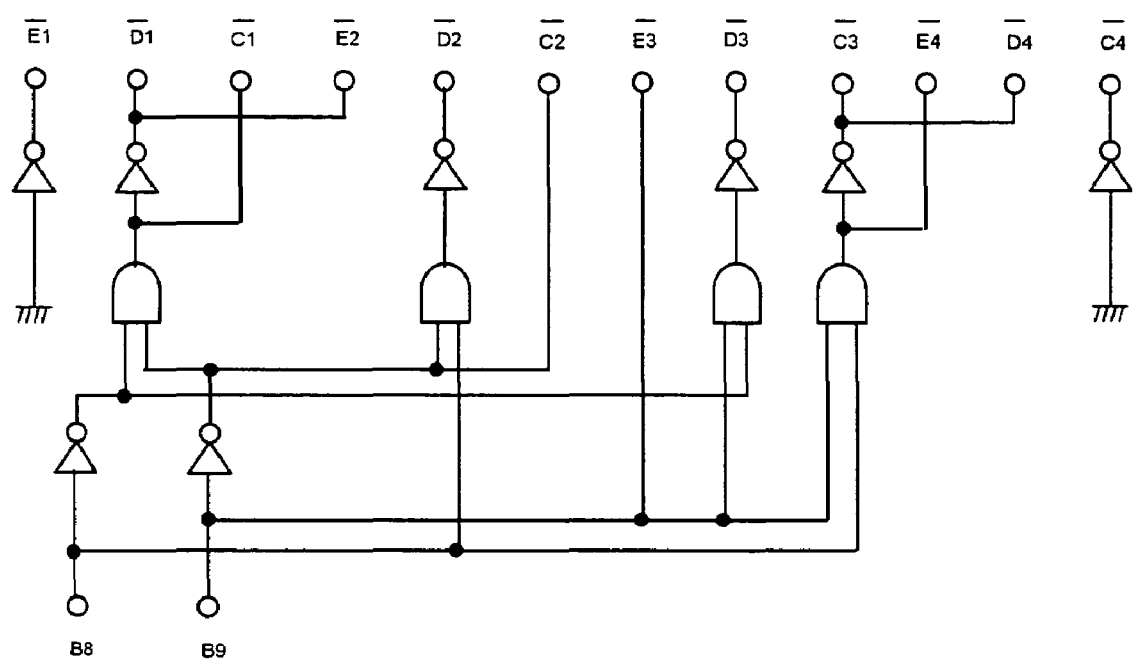
FIG. 5A is a circuit diagram showing an internal configuration of a decoder being used in the second embodiment.

A voltage of a voltage source V901 shown in FIG. 4B is an arbitrary fixed voltage, and is set within a voltage range for a transistor M913 to exhibit saturated characteristics. As shown in FIGS. 5A and 5B, either of signals C, D, or E (C1 through C4, D1 through D4, E1 through E4) of a decoder 330B is set active to flow currents through resistors. FIG. 5A shows a circuit diagram of the decoder 330B, while FIG. 5B shows a truth table of the decoder 330B.

The nodes VA, VB and VC shown in FIG. 4B are fixed to the same potential using voltage followers composed of differential amplifiers 8D and 8E, respectively. The current $I_{REF}$ inputted as the reference current is shunt into the currents I1 through I4. The current I1 passes through either of selection transistors M901, M905, or M909 to be outputted to any one of the nodes VA, VB, and VC. The currents I2, I3, and I4 are similarly outputted to either of the nodes VA, VB, or VC.

When the selection transistors M901 through M912 are of the same size, they have the same on-resistance, so that the same voltage is applied to the resistor R and the selection transistors M901 through M912. For this reason, currents obtained by equally shunting the current $I_{REF}$ under no influence of the on-resistance will be current segments, namely the currents I1 through I4. When the digital codes B9=1, B8=0, B7=1 are inputted, the selection transistors M901, M902, M907, and M912 are set to an on-state, so that the currents I1+I2, I3, and I4 are outputted to the nodes VA, VB, and VC, respectively. Since the node VC is connected to the output terminal of the voltage follower, it does not contribute to the D/A converted output current.

The D/A converter block 320 shown in FIG. 4B for D/A converting the lower bits has the same configuration as that of the first embodiment, where the currents passing through the nodes VA and VB are similarly D/A converted to be outputted to the current output terminal $I_{OUT}$ as the D/A converted output current.

As with the first embodiment, this embodiment can achieve the D/A converted output current with the excellent differential linearity regardless of the presence of the potential variation of the currents I1 through I4 due to the manufacturing variability.

Third Embodiment

Figure 6A:
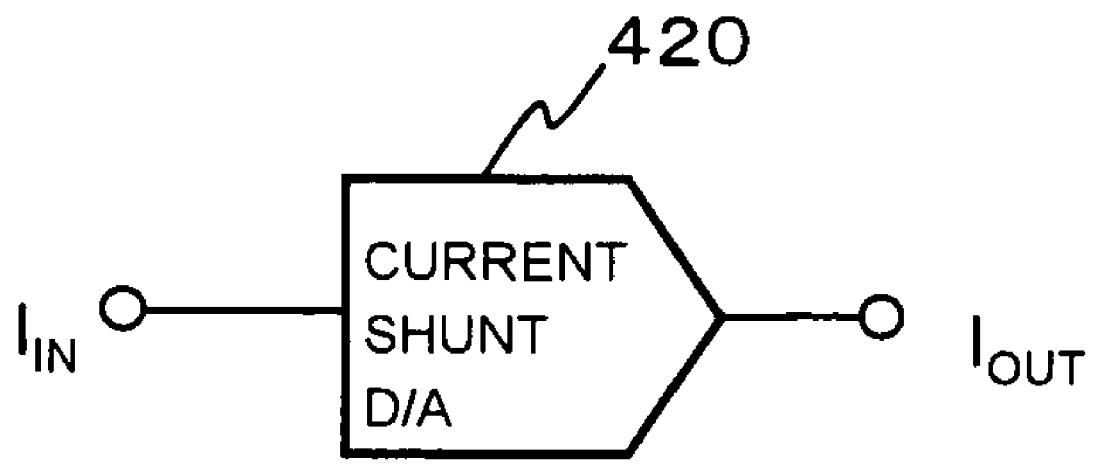
FIG. 6A is a schematic circuit diagram showing a configuration of a D/A converter block in a D/A converter according to a third embodiment of the present invention.
Figure 6B:
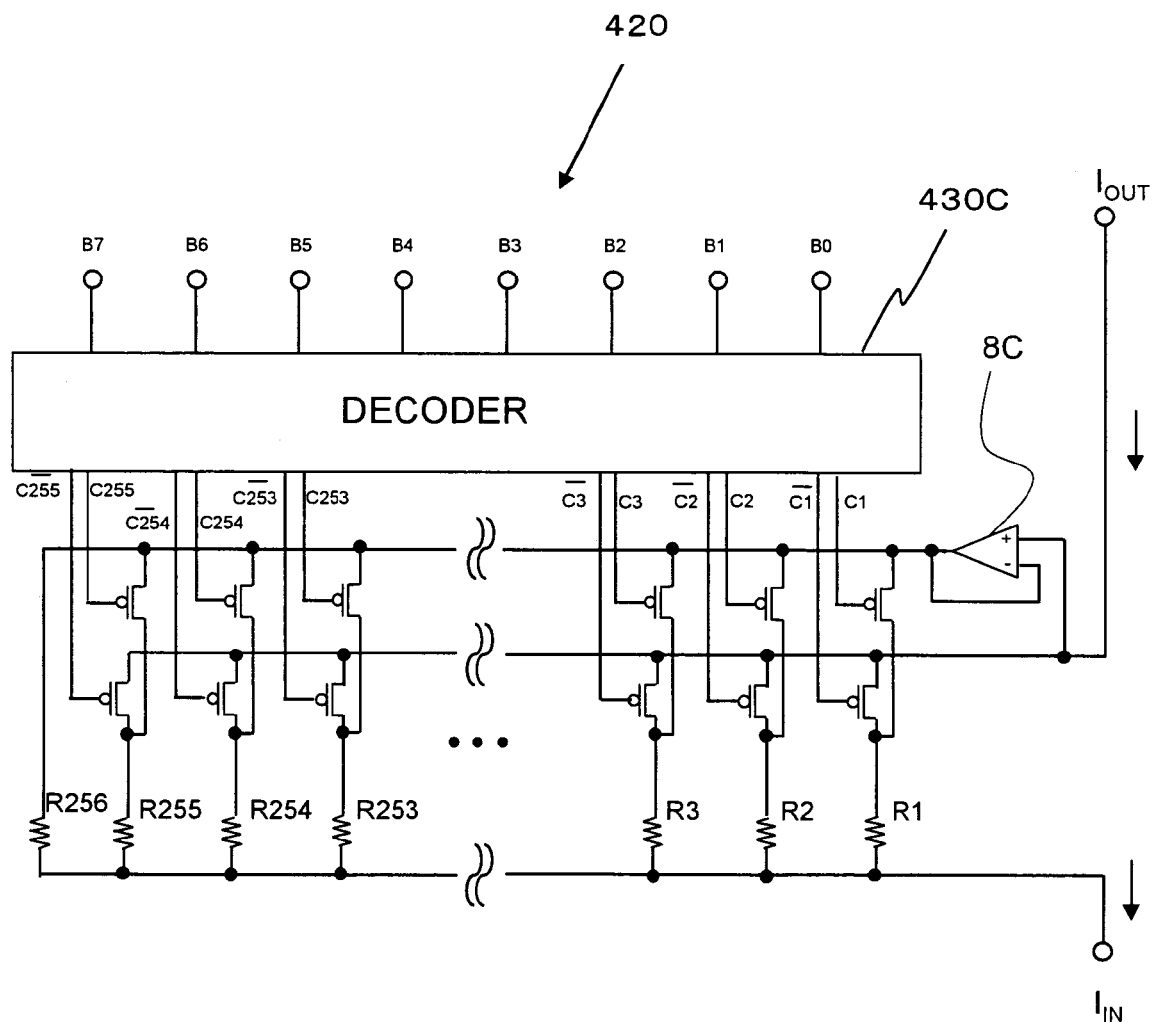
FIG. 6B is a specific circuit diagram showing a configuration of the D/A converter block in the D/A converter according to the third embodiment of the present invention.

This third embodiment is characterized by using a D/A converter block 420 by the shunt currents shown in FIGS. 6A and 6B instead of the D/A converter blocks 220 and 320 composed of the R-2R resistor section according to the first and second embodiments. The other configuration is the same as that of the first and second embodiments. FIG. 6A shows a schematic circuit diagram of the D/A converter block 420 according to the third embodiment of the present invention, while FIG. 6B shows a specific circuit diagram of the D/A converter block 420 thereof. In FIG. 6B, symbols R1 through R255 represent resistors having the same resistance value. Symbol 430C represents a decoder. Symbol 8C represents a differential amplifier composing the voltage follower and has a similar function to that of the foregoing embodiments.

Figure 7A:
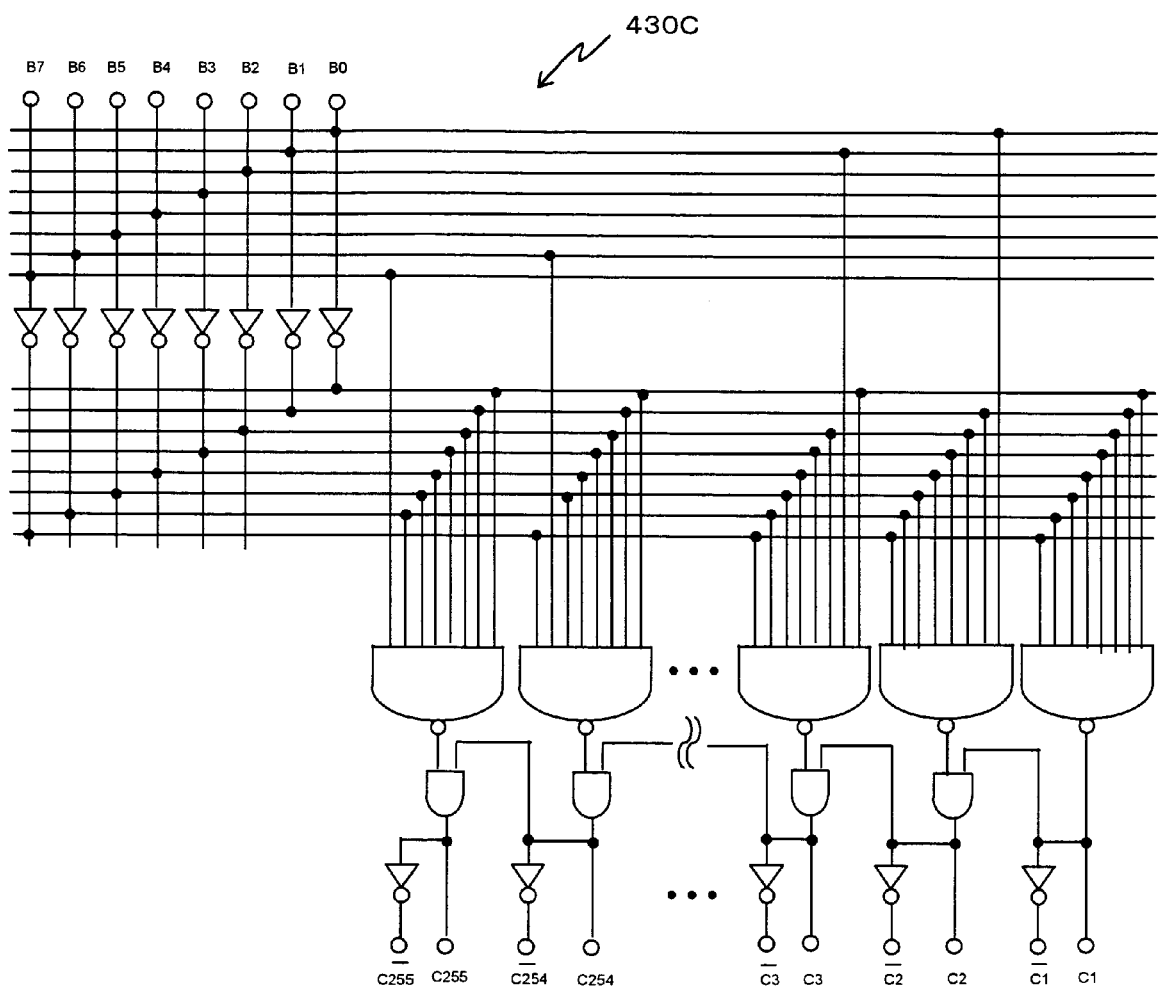
FIG. 7A is a circuit diagram showing an internal configuration of a decoder being used in the third embodiment.

A configuration of the decoder 430C is shown in FIGS. 7A and 7B. FIG. 7A shows a circuit diagram of the decoder 430C, while FIG. 7B shows a truth table of the decoder 430C.

According to the first and second embodiments, in order improve the differential linearity errors at three points corresponding to the upper 2 bits that cause an issue in the characteristic graph shown in FIG. 12, the D/A conversion using the segment manner has been performed. In addition, as for the consecutive remaining 8 (=10−2) bits, the D/A converted has been performed in the D/A converter block including the shunt using the R-2R resistors.

In order to eliminate the differential linearity error, which still slightly occurs, however, the configuration according to the third embodiment may be advantageously used. All the resistors R1 through R256 shown in FIG. 6B are not weighted and have the same value R. Although any of the resistors R has the error significantly large enough to be changed by two times, the error in the current would be as small as about 1LSB, thereby making it possible to sufficiently improve the differential linearity error.

Fourth Embodiment

Figure 8A:
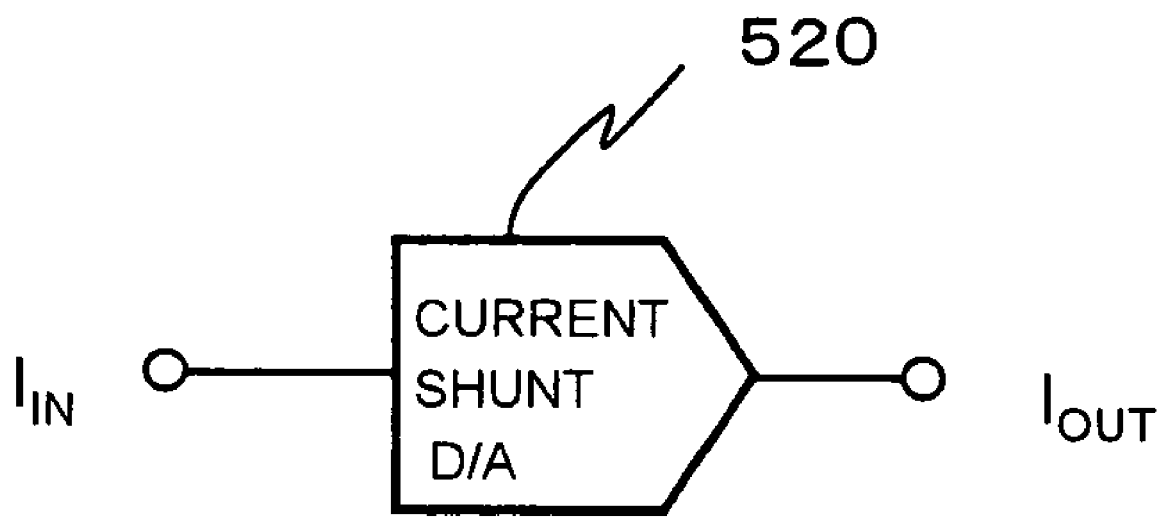
FIG. 8A is a schematic circuit diagram showing a configuration of a D/A converter block in a D/A converter according to a fourth embodiment of the present invention.
Figure 8B:
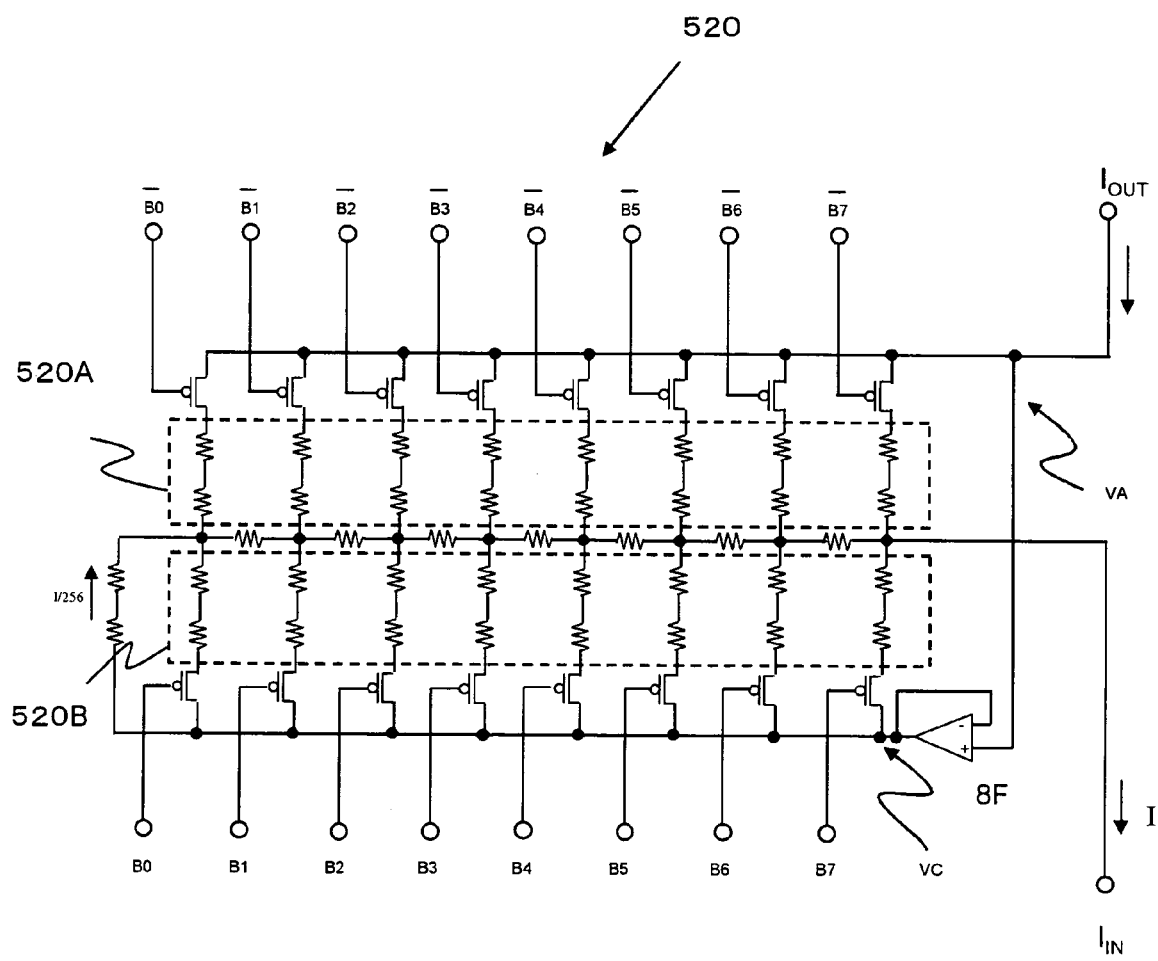
FIG. 8B is a specific circuit diagram showing a configuration of the D/A converter block in the D/A converter according to the fourth embodiment of the present invention.

This fourth embodiment is characterized by using a D/A converter block 520 by the shunt currents shown in FIGS. 8A and 8B instead of the D/A converter blocks 220 and 320 composed of the R-2R resistor section according to the first and second embodiments. The other configuration is the same as that of the first and second embodiments. FIG. 8A shows a schematic circuit diagram of the D/A converter block 520 according to the fourth embodiment of the present invention, while FIG. 8B shows a specific circuit diagram of the D/A converter block 520 thereof. In FIG. 8B, symbols 520A and 520B represent resistor arrays. Symbol 8F represents a differential amplifier composing the voltage follower and has a similar function to that of the foregoing embodiments.

The nodes VA and VC shown in FIG. 8B are set to the same potential using a voltage follower composed of the differential amplifier 8F. Since the selection transistors provided in the resistance arrays 520A and 520B are set to an on-state exclusively, the current is similarly shunt by the R-2R resistors shown in FIG. 1B, so that the operation is performed similar to that of the first and second embodiments. The fourth embodiment is an example in which the connection of the R-2R resistors is modified, and can similarly perform the D/A conversion with the excellent differential linearity.

Fifth Embodiment

Figure 9A:
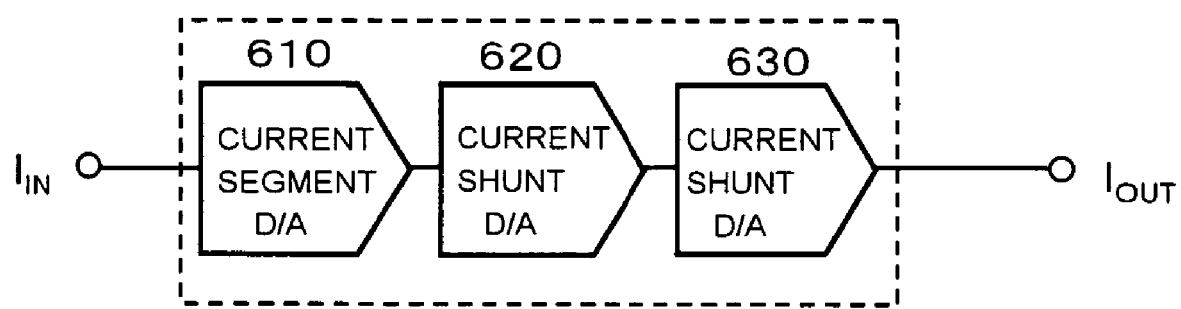
FIG. 9A is a schematic circuit diagram showing a configuration of a D/A converter according to a fifth embodiment of the present invention.
Figure 9B:
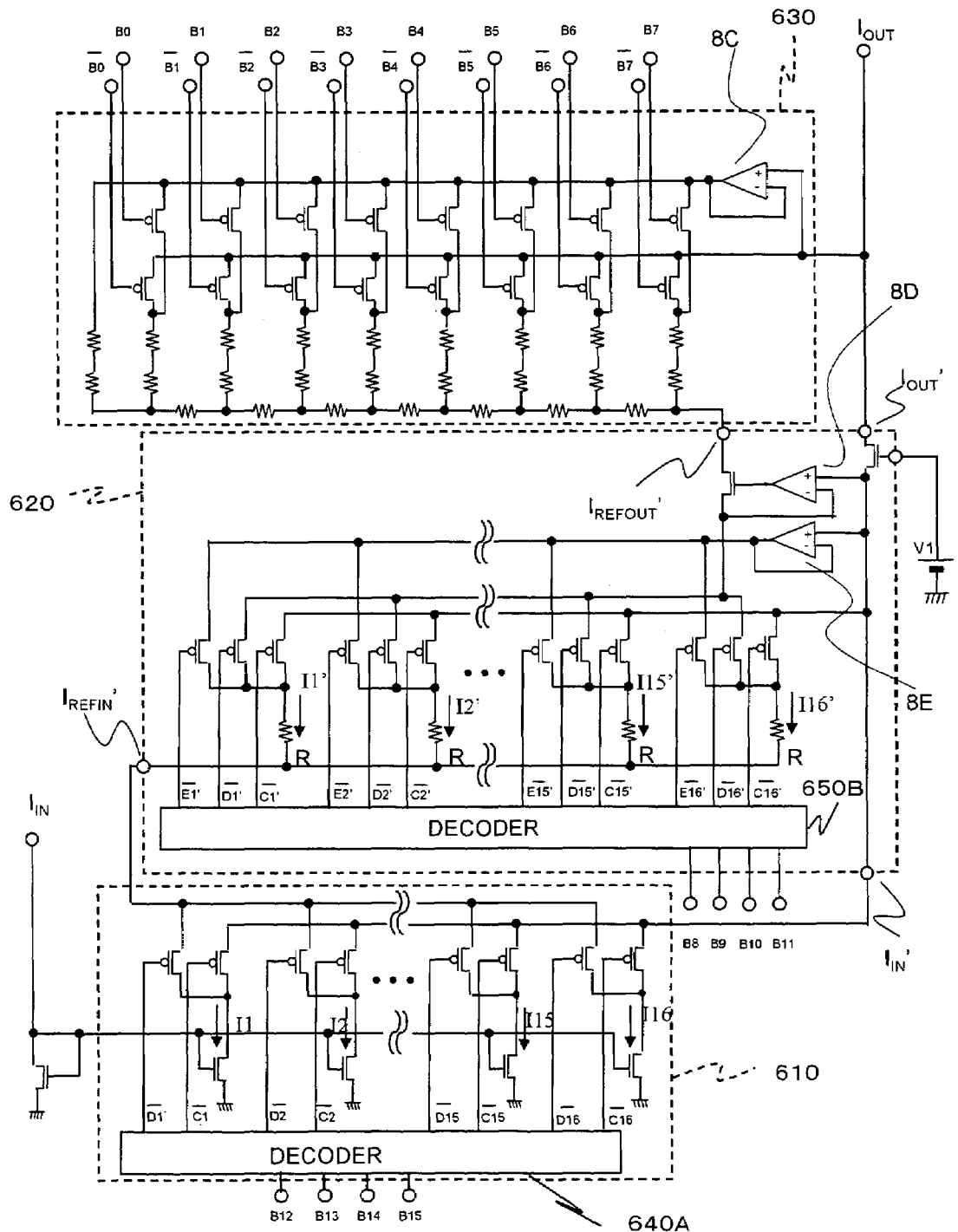
FIG. 9B is a specific circuit diagram showing the configuration of the D/A converter according to the fifth embodiment of the present invention.

FIGS. 9A and 9B show a D/A converter according to a fifth embodiment of the present invention. The fifth embodiment shows an example of the 16-bit D/A converter. FIG. 9A shows a schematic circuit diagram according to the fifth embodiment of the present invention, while FIG. 9B shows a specific circuit diagram thereof.

The embodiment shown in FIGS. 9A and 9B represents a circuit for performing a three-step D/A conversion. In the first step for D/A converting upper 4 bits (B15 through B12), the D/A conversion using the current segment manner is performed. In the second step for D/A converting intermediate 4 bits (B11 through B8), the D/A conversion using the current segment manner is performed utilizing the shunt currents. In the third step for D/A converting lower 8 bits (B7 through B0), the D/A conversion is performed using the currents shunt by the R-2R resistors.

Symbol 610 represents a D/A converter block for D/A converting the upper 4 bits by the current segment manner. Symbol 620 represents a D/A converter block for D/A converting the intermediate 4 bits by the current segment manner using the shunt currents. Symbol 630 represents a D/A converter block for D/A converting the lower 8 bits using the currents shunt by the R-2R resistors.

A decoder 640A is the decoder shown in FIGS. 2A and 2B extended to the 4-bit length, while a decoder 650B is the decoder shown in FIGS. 5A and 5B extended to the 4-bit length.

The D/A converter block 610 D/A converts the upper 4 bits in the first step using the current segments (I1 through I16), where a current $I_{REFIN}'$, one of the output currents from the D/A converter block 610, is inputted to the current $I_{REF}$ in FIG. 4B as the reference current of the D/A converter in the second embodiment (refer to FIG. 4B), while the other added output current is connected to the node VA in FIG. 4B. The three-step D/A conversion is performed according to such a configuration.

When the 16-bit D/A converter shown in the fifth embodiment is applied to the first or second embodiment, the number of bits to be converted in the first step D/A conversion will be 8 bits. In this case, the current segments in the first step will be $2^8=256$ in total.

In the fifth embodiment, however, the D/A conversion in the first and second steps can be performed using the current segments totaling $2^4+2^4=32$ in the first and the second D/A converting portions, a potential effect for reducing an increase in pattern layout area may be expected.

Moreover, when the steps is further increased to more than three, it is preferred to add the D/A converter block 620 shown in FIGS. 9A and 9B to be connected in series, and to achieve current connections between the currents $I_{REFIN'}$ and $I_{REFOUT'}$, and the currents $I_{IN'}$ and $I_{OUT'}$. By applying this fifth embodiment, the D/A conversion with the excellent differential linearity can be performed without significantly increasing the pattern area even in a large bits D/A conversion.

The D/A converter according to the present invention may be used for a comparison type D/A converter. Furthermore, a signal converter may also be configured using the comparison type D/A converter composed of the D/A converter according to the present invention.

INDUSTRIAL APPLICABILITY

The present invention relates to the signal converter of driving the laser diode with the current. The signal converter includes the D/A and A/D converters, and that the differential linearity error of he D/A converter being used for it is small is required for setting the stable laser output. In the high-resolution D/A converter, the differential linearity tends to deteriorate due to the manufacturing variability. Implementation of the present invention may prevent the differential linearity error to occur, contributing to an improvement in manufacturing yield. Moreover, the present invention can be widely utilized for the current output type D/A converter.

What is claimed is:

1. A D/A converter comprising: a first D/A converter block for converting upper bits of digital data having of a plurality of bits; and a second D/A converter block for converting lower bits of the digital data, said digital data being D/A converted in two steps using said first D/A converter block and said second D/A converter block, wherein said first D/A converter block comprises two or more constant current sources, a first switch for adding respective output currents from a part of said two or more constant current sources, the number of the part corresponds to a value of the upper bits of said digital data, to output an added current, and a second switch for supplying a current from the remaining one constant current source of said two or more constant current sources to said second D/A converter block, wherein said second D/A converter block comprises a current shunt for shunting the current supplied from said first D/A converter block at a shunt ratio corresponding to a value of the lower bits of said digital data and outputting a shunt current, and wherein the current outputted from said first switch and the shunt current outputted from said current shunt are added each other, so that a current corresponding to said digital data is outputted.

2. An A/D converter for performing an A/D conversion using the D/A converter according to claim 1.

3. A signal converter including at least one A/D converter according to claim 2, wherein an output current is controlled using the D/A converter included in said A/D converter.

4. A signal converter including at least one D/A converter according to claim 1, wherein an output current is controlled using said D/A converter.

5. A D/A converter comprising: a first D/A converter block for converting upper bits of digital data having of a plurality of bits; and a second D/A converter block for converting lower bits of the digital data, said digital data being D/A converted in two steps by said first D/A converter block and said second D/A converter block, wherein said first D/A converter block comprises a first current shunt for shunting a constant current outputted from a reference current source at a shunt ratio corresponding to a value of the upper bits of said digital data to output a shunt current, and shunting a current outputted from said reference current source into a value corresponding to a weight of a Least Significant Bit among the upper bits of said digital data to supply a shunt current to said second D/A converter block, wherein said second D/A converter block comprises a second current shunt for shunting the current supplied from said first D/A converter block at a shunt ratio corresponding to a value of the lower bits of said digital data to output a shunt current, and wherein the current outputted from said first current shunt and the current outputted from said second current shunt are added each other, so that a current corresponding to said digital data is outputted.

6. The D/A converter according to claim 5, in order to D/A convert extended digital data having an additional bit on an upper bit side of said digital data, further comprising a current segment type D/A converter block which is composed of two or more current sources and outputs a current corresponding to a value of said additional bit, wherein said reference current source is any one of said two or more current sources, and wherein the output current from said current segment type D/A converter block is added to the output current from said first current shunt and the output current from said second current shunt, so that a current corresponding to said extended digital data is outputted.

7. An A/D converter for performing an A/D conversion using the D/A converter according to claim 6.

8. A signal converter including at least one A/D converter according to claim 7, wherein an output current is controlled using the D/A converter included in said A/D converter.

9. A signal converter including at least one D/A converter according to claim 6, wherein an output current is controlled using said D/A converter.

10. An A/D converter for performing an A/D conversion using the D/A converter according to claim 5.

11. A signal converter including at least one A/D converter according to claim 10, wherein an output current is controlled using the D/A converter included in said A/D converter.

12. A signal converter including at least one D/A converter according to claim 5, wherein an output current is controlled using said D/A converter.

* * * * *